United States Patent
Onogi et al.

(10) Patent No.: US 9,941,366 B2
(45) Date of Patent: Apr. 10, 2018

(54) SEMICONDUCTOR DEVICE AND MANUFACTURING METHOD OF SEMICONDUCTOR DEVICE

(71) Applicants: Atsushi Onogi, Toyota (JP); Shinichiro Miyahara, Nagoya (JP)

(72) Inventors: Atsushi Onogi, Toyota (JP); Shinichiro Miyahara, Nagoya (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 39 days.

(21) Appl. No.: 15/105,278

(22) PCT Filed: Oct. 14, 2014

(86) PCT No.: PCT/JP2014/077320
§ 371 (c)(1),
(2) Date: Jun. 16, 2016

(87) PCT Pub. No.: WO2015/098244
PCT Pub. Date: Jul. 2, 2015

(65) Prior Publication Data
US 2016/0315157 A1    Oct. 27, 2016

(30) Foreign Application Priority Data

Dec. 25, 2013  (JP) ................................. 2013-267788

(51) Int. Cl.
*H01L 21/324* (2006.01)
*H01L 29/06* (2006.01)
*H01L 29/66* (2006.01)
*H01L 29/78* (2006.01)
*H01L 29/40* (2006.01)
(Continued)

(52) U.S. Cl.
CPC .......... *H01L 29/408* (2013.01); *H01L 21/324* (2013.01); *H01L 29/06* (2013.01); *H01L 29/0623* (2013.01); *H01L 29/12* (2013.01); *H01L 29/1608* (2013.01); *H01L 29/66734* (2013.01); *H01L 29/78* (2013.01); *H01L 29/7811* (2013.01); *H01L 29/7813* (2013.01);
(Continued)

(58) Field of Classification Search
CPC ... H01L 21/324; H01L 29/06; H01L 29/1608; H01L 29/78
See application file for complete search history.

(56) References Cited

U.S. PATENT DOCUMENTS 6,180,490 B1   1/2001  Vassiliev et al.
6,291,331 B1   9/2001  Wang et al.
(Continued)

FOREIGN PATENT DOCUMENTS

JP   H08-78407 A    3/1996
JP   2006-202940 A  8/2006
(Continued)

*Primary Examiner* — Marvin Payen
*Assistant Examiner* — Vernon P Webb
(74) *Attorney, Agent, or Firm* — Oliff PLC

(57) ABSTRACT

Described herein is a semiconductor device comprising: a semiconductor substrate; a trench provided at a surface of the semiconductor substrate; a first insulating layer covering an inner surface of the trench; and a second insulating layer located at a surface of the first insulating layer in the trench. A refraction index of the first insulating layer is larger than a refraction index of the second insulating layer.

1 Claim, 10 Drawing Sheets

(51) Int. Cl.
  *H01L 29/12* (2006.01)
  *H01L 29/16* (2006.01)
  *H01L 21/02* (2006.01)
(52) U.S. Cl.
  CPC ...... *H01L 21/022* (2013.01); *H01L 21/02164* (2013.01); *H01L 21/02271* (2013.01)

(56) References Cited

U.S. PATENT DOCUMENTS

| | | | |
|---|---|---|---|
| 2004/0227182 A1* | 11/2004 | Darwish | H01L 21/2253 257/330 |
| 2007/0252873 A1 | 11/2007 | Saito et al. | |
| 2010/0285617 A1 | 11/2010 | Saito et al. | |
| 2011/0201173 A1 | 8/2011 | Miyahara | |
| 2013/0082301 A1 | 4/2013 | Onozawa et al. | |
| 2013/0087852 A1* | 4/2013 | Kim | H01L 29/42372 257/330 |

FOREIGN PATENT DOCUMENTS

| | | |
|---|---|---|
| JP | 2009-130069 A | 6/2009 |
| JP | 2011-171500 A | 9/2011 |
| JP | 2011-216651 A | 10/2011 |
| JP | 2012-016952 A | 1/2012 |
| WO | 2012/124784 A1 | 9/2012 |

* cited by examiner

SEMICONDUCTOR DEVICE AND MANUFACTURING METHOD OF SEMICONDUCTOR DEVICE

CROSS-REFERENCE TO RELATED APPLICATION

This application is a related application of and claims priority to Japanese Patent Application No. 2013-267788 filed on Dec. 25, 2013, the entire contents of which are hereby incorporated by reference into the present application.

TECHNICAL FIELD

A technology disclosed herein relates to a semiconductor device and a method for manufacturing a semiconductor device.

BACKGROUND ART

For example, Japanese Patent Application Publication No. 2006-202940 (hereinafter referred to as "Patent Document 1") discloses a semiconductor device including a semiconductor substrate in which an element region and a termination region located outside of the element region are provided. The element region includes: a gate trench; a gate insulating film covering an inner surface of the gate trench; and a gate electrode provided inside of the gate insulating film. The termination region includes: a termination trench; and a termination insulating layer filling an inner part of the termination trench. The provision of the termination region allows the semiconductor device to have a higher voltage resistance.

SUMMARY OF INVENTION

Technical Problem

An insulating layer located in a trench, such as the aforementioned termination insulating layer, is formed by depositing an insulating material in the trench under a predetermined pressure and then performing heat treatment thereon. At this occasion, forming the insulating layer under a high pressure makes an embeddability of the insulating material into the trench high but makes it easy for the insulating material to contract in the heat treatment step and therefore makes it easy for the insulating layer to crack. Meanwhile, forming the insulating layer under a low pressure makes it difficult for the insulating material to contract in the heat treatment step and therefore makes it difficult for the insulating layer to crack; however, the embeddability of the insulating material into the trench is so poor that it is easy for a void to be generated in the insulating layer.

The present specification discloses a semiconductor device that can restrain a crack or a void from being generated in an insulating laser in a trench and to method for manufacturing such a semiconductor device.

Solution to Technical Problem

An aspect of a technique described herein is a semiconductor device comprising: a semiconductor substrate; a trench provided at a surface of the semiconductor substrate; a first insulating layer covering an inner surface of the trench; and a second insulating layer located at a surface of the first insulating layer in the trench. A refraction index of the first insulating layer is larger than a refraction index of the second insulating layer.

In the semiconductor device described above, a conductor to which a gate potential is applied (i.e., a gate electrode) may not be provided in the trench.

In the semiconductor device described above, the refraction index of the first insulating layer is larger than the refraction index of the second insulating layer. The first insulating layer is difficult to contract in the process of manufacturing the semiconductor device. The second insulating layer is easy to contract in the process of manufacturing the semiconductor device. Since the first insulating layer and the second insulating layer are disposed in the trench, an excessive stress is prevented from being generated due to the contraction of the insulating material in the process of manufacturing the semiconductor device. Therefore, in the process of manufacturing the semiconductor device, a crack is difficult to be generated in the insulating layers in the trench. Further, although the first insulating layer is not very good in embeddability in the process of manufacturing the semiconductor device, the embeddability of the insulating material will not be problematic during the formation of the first insulating layer, as the first insulating layer is formed to cover the inner surface of the trench. Thereafter, in forming the second insulating layer at a surface of the first insulating layer, the second insulating layer can be suitably formed, as the insulating material is good in embeddability. Therefore, in the process of manufacturing the semiconductor device, a void is difficult to be generated in the insulating layers in the trench. That is, this semiconductor device is difficult to suffer from a void or a crack in the insulating layers in the manufacturing process.

An element region and a termination region surrounding the element region may be provided in the semiconductor substrate. The element region may compose: a gate trench; a gate insulating film covering an inner surface of the gate trench; and a gate electrode located inside of the gate insulating film. The termination region may comprise the trench comprising the first and second insulating layers at its inside.

This configuration makes it possible to obtain a semiconductor device including an element region and a termination region.

The first insulating layer may cover an upper surface of the semiconductor substrate and an entirety of an inner surface of the trench. The second insulating layer may be filled in the trench and is provided at an upper surface of the first insulating layer provided at the upper surface of the semiconductor substrate. The termination region may comprise a third insulating layer provided at an upper surface of the second insulating layer. A refraction index of the third insulating layer may be larger than the refraction index of the second insulating layer.

The third insulating layer, whose refraction index is large, is difficult to contract in the process of manufacturing the semiconductor device. This makes it possible to restrain the insulating layers (i.e., the first insulating layer, the second insulating layer, and the third insulating layer) at the surface of the semiconductor substrate from cracking. Further, since a thick layer can be formed at the surface of the semiconductor substrate, the semiconductor device can also be made higher in voltage resistance.

An aspect of a technique described herein is a manufacturing method of a semiconductor device, the method comprising: depositing a first insulating layer inside of a trench in a semiconductor substrate comprising the trench under a first pressure; depositing a second insulating layer inside of the trench under a second pressure higher than the first pressure after the first insulating layer has been deposited; and performing a heat treatment on the semiconductor substrate after the second insulating layer has been deposited.

The first insulating layer, which is formed by depositing an insulating material under the first pressure lower than the second pressure, is difficult to contract by the subsequent heat treatment. On the other hand, the second insulating film, which is formed by depositing an insulating material under the second pressure, is easy to contract by the subsequent heat treatment. The formation of the first insulating layer and the second insulating layer in the trench prevents an excessive stress from being generated due to the contraction of insulating material in the process of manufacturing the semiconductor device. Therefore, this manufacturing method makes it difficult for a crack to be generated in the insulating layers in the trench. Further, although the first insulating layer is not very good in embeddability, the embeddability of the insulating material will not be problematic during the formation of the first insulating layer, as the first insulating layer is formed to cover the inner surface of the trench. Thereafter, in forming the second insulating layer at a surface of the first insulating layer, the second insulating layer can be suitably formed, as the insulating material is good in embeddability.

The depositing the first insulating layer may include forming the first insulating layer at an upper surface of the semiconductor substrate. The depositing the second insulating layer may include depositing the second insulating layer at an upper surface of the first insulating layer deposited at the upper surface of the semiconductor substrate. The method may further comprise: depositing a third insulating layer at an upper surface of the second insulating layer under a third pressure lower than the second pressure.

The third insulating layer, which is deposited under the third pressure, is difficult to contact by the subsequent heat treatment. Therefore, the method described above makes it possible to restrain the insulating layers (i.e., the first insulating layer, the second insulating layer, and the third insulating layer) at the surface of the semiconductor substrate from cracking. Further, since a thick layer can be formed at the surface of the semiconductor substrate, the semiconductor device can also be made higher in voltage resistance.

The manufacturing method may further comprise: removing a part of the first and second insulating layers in the trench; forming a gate insulating film covering an inner surface of a gate trench after the part of the first and second insulating layers has been removed; and forming a gate electrode inside of the gate insulating film.

This configuration makes it possible to form the gate electrode in the trench.

DESCRIPTION OF EMBODIMENTS

First Embodiment (Structure of Semiconductor Device 100)

Figure 1:
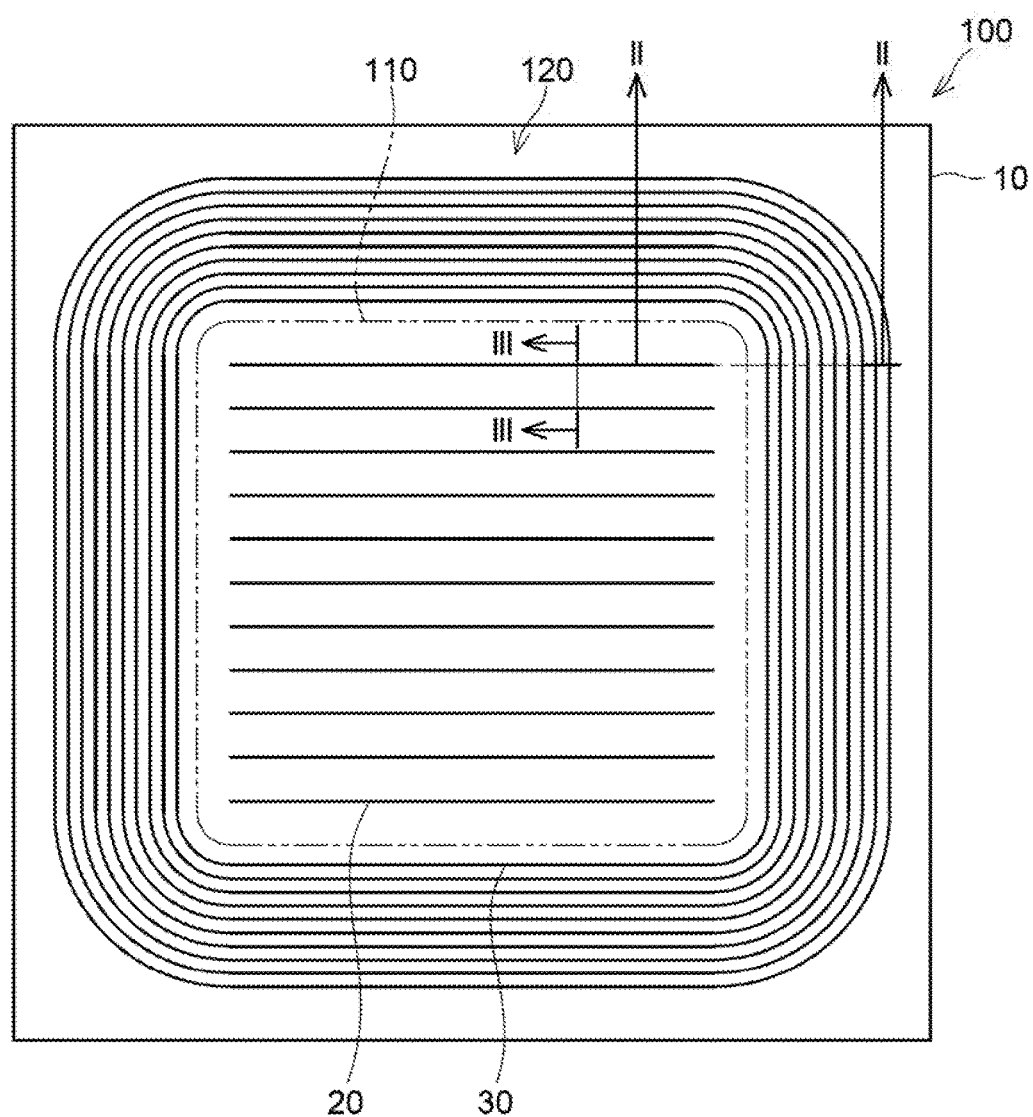
FIG. 1 is a plan view of a semiconductor device.

As shown in FIG. 1, a semiconductor device 100 according to as first embodiment comprises a semiconductor substrate 10 in which an element region 110 through which electric current flows and a termination region 120 surrounding the element region 110 are provided. The semiconductor device 100 according to the first embodiment is a power MOSFET.

As shown in FIG. 1, the element region 110 includes a plurality of gate trenches 20 extending parallel to each other. The termination region 120 includes a plurality of termination trenches 30 surrounding an outside of the element region 110. Each of the termination trenches 30 encircles around the outside of the element region 110. It should be noted that, for ease of understanding. FIG. 1 omits to illustrate various types of insulating layers, electrodes, and wiring provided at an upper surface of the semiconductor substrate 10.

Figure 2:
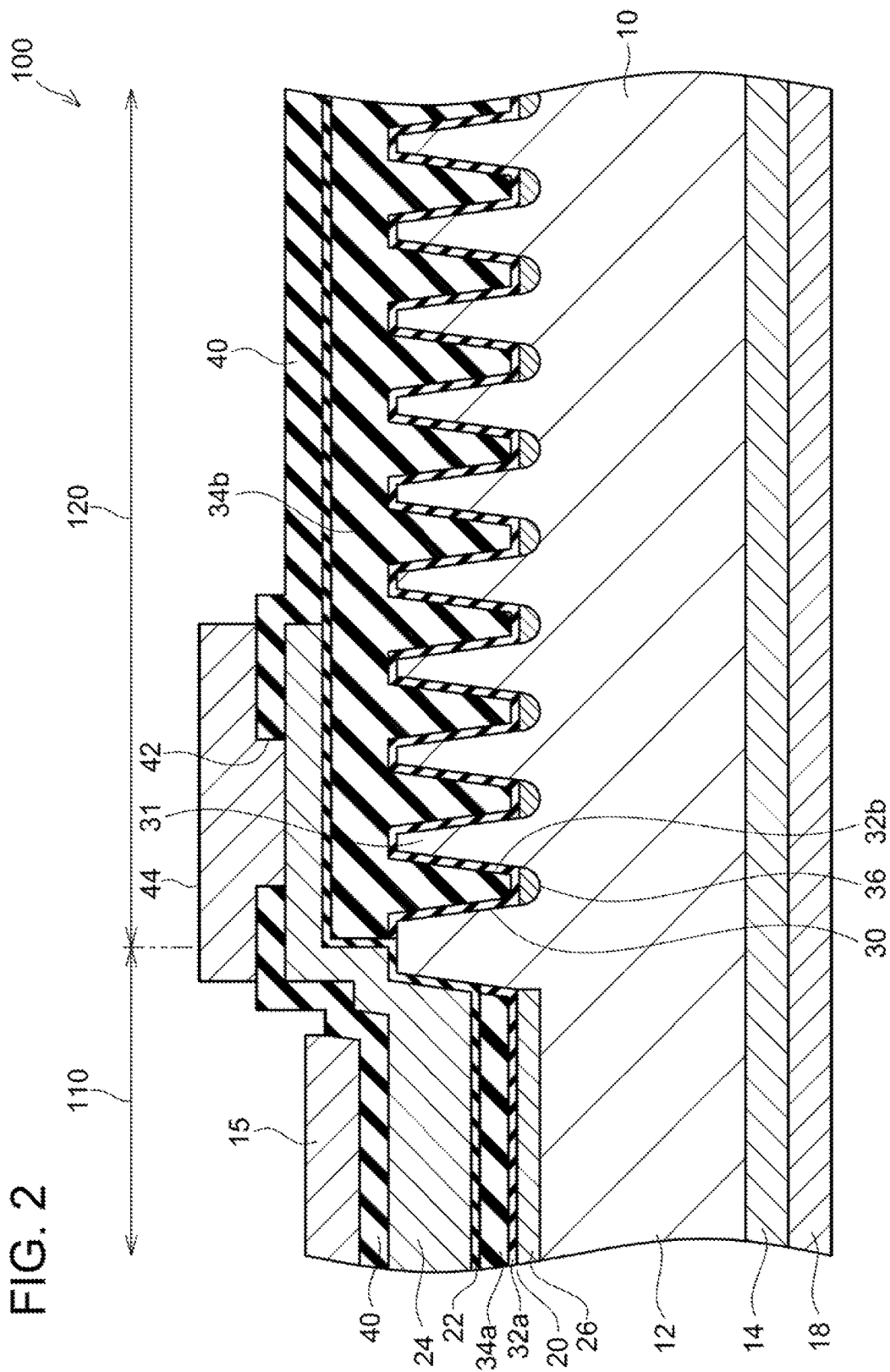
FIG. 2 is a cross-sectional view of the semiconductor device as taken along line II-II.
Figure 3:
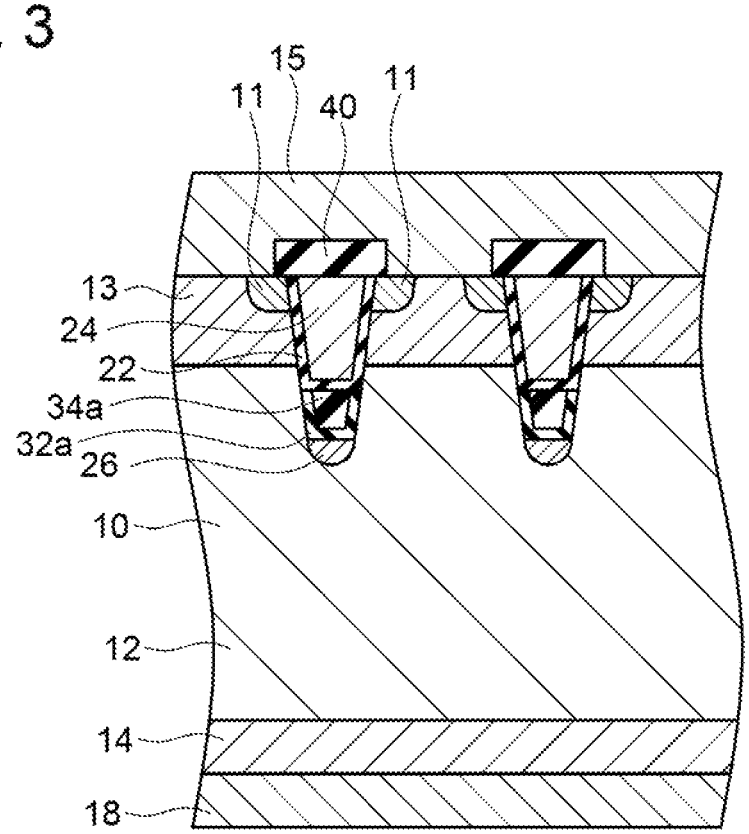
FIG. 3 is a cross-sectional view of the semiconductor device as taken along line III-III.

With reference to FIGS. 2 and 3, structures in the element region 110 and the termination region 120 will be described. As shown in FIG. 2, an n-type drift region 12 is provided in the semiconductor substrate 10 in the element region 110. Further, as shown in FIG. 3, an $n^+$-type source region 11 is provided in an area facing a surface of the semiconductor substrate 10. Further, a p-type body region 13 is provided below the source region 11 and above the drift region 12. An $n^+$-type drain region 14 is provided in an area facing a back surface of the semiconductor substrate 10. An upper surface of the source region 11 is in ohmic contact with a source electrode 15. A lower surface of the drain region 14 is in ohmic contact with a drain electrode 18.

Further, as noted above, the plurality of gate trenches 20 is provided at the surface of the semiconductor substrate 10 in the element region 110. A p-type floating region 26 is provided at a lower end of each of the gate trenches 20. A first insulating layer 32a is provided inside of the gate trench 20 near the lower end. A second insulating layer 34a is provided above the first insulating layer 32a. A refraction index of the first insulating layer 32a is larger than a refraction index of the second insulating layer 34a. A gate insulating film 22 is provided at an upper surface of the second insulating layer 34a and at a side surface of the gate trench 20. A gate electrode 24 filled in the gate trench 20 is provided inside of the gate insulating film 22. An interlayer insulating film 40 is provided at an upper surface of the gate electrode 24. The interlayer insulating film 40 allows the gate electrode 24 to be electrically insulated from the source electrode 15. The interlayer insulating film 40 has higher phosphorus and boron contents per unit volume than the first and second insulating layers 32a and 34a.

As shown in FIG. 2, an n-type drift region 12 and an $n^+$-type drain region 14 are also provided in the semiconductor substrate 10 in the termination region 120. The drift region 12 and the drain region 14 in the termination region 120 are continuous with the drift region 12 and the drain region 14 in the element region 110. Also in the termination region 120, the lower surface of the drain region 14 is in ohmic contact with the drain electrode 18.

The plurality of termination trenches 30 is provided at the surface of the semiconductor substrate 10 in the termination region 120. Each of the termination trenches 30 is provided at substantially the same depth as the gate trenches 20 in the element region 110. A p-type floating region 36 is provided at a lower end of each of the termination trenches 30. A first insulating layer 32b is provided inside of the termination trenches 30. The first insulating layer 32b is also provided at upper surface portions of partition walls 31 between the adjacent termination trenches 30. A second insulating layer 34b is provided inside of the first insulating layer 32b. The second insulating layer 34b is filled in the termination trenches 30. Further, the second insulating layer 34b is also laminated on the upper surface of the semiconductor substrate 10 (i.e., on the first insulating layer 32b on the partition walls 31). The first insulating layer 32b and the second insulating layer 34b in the termination region 120 are insulating layers having the same properties as the first insulating layer 32a and the second insulating layer 34a in the element region 110, respectively. That is, a refraction index of the first insulation layer 32b is larger than a refraction index of the second insulating layer 34b.

A gate insulating film 22 is provided at the upper surface of the second insulating layer 34b. The gate insulating film 22 in the termination region 120 is continuous with the gate insulating film 22 in the element region 110. In a part of an upper surface of the gate insulating film 22 in the termination region 120, the gate electrode 24 provided in the element region 110 is extended. An interlayer insulating film 40 is provided at the upper surface of the gate electrode 24 and an upper surface of the gate insulating film 22 in an area in which the gate electrode 24 is not provided. The interlayer insulating film 40 in the termination region 120 is continuous with the interlayer insulating film 40 in the element region 110. The interlayer insulating film 40 in the termination region 120 includes a portion provided at the upper surface of the gate electrode 24, and in this portion, a contact hole 42 is provided. A gate wiring 44 is provided at an upper surface of the interlayer insulating film 40 in the termination region 120. The gate wiring 44 passes through the contact hole 42 and is electrically connected to the gate electrode 24.

(Manufacturing Method)

Figure 4:
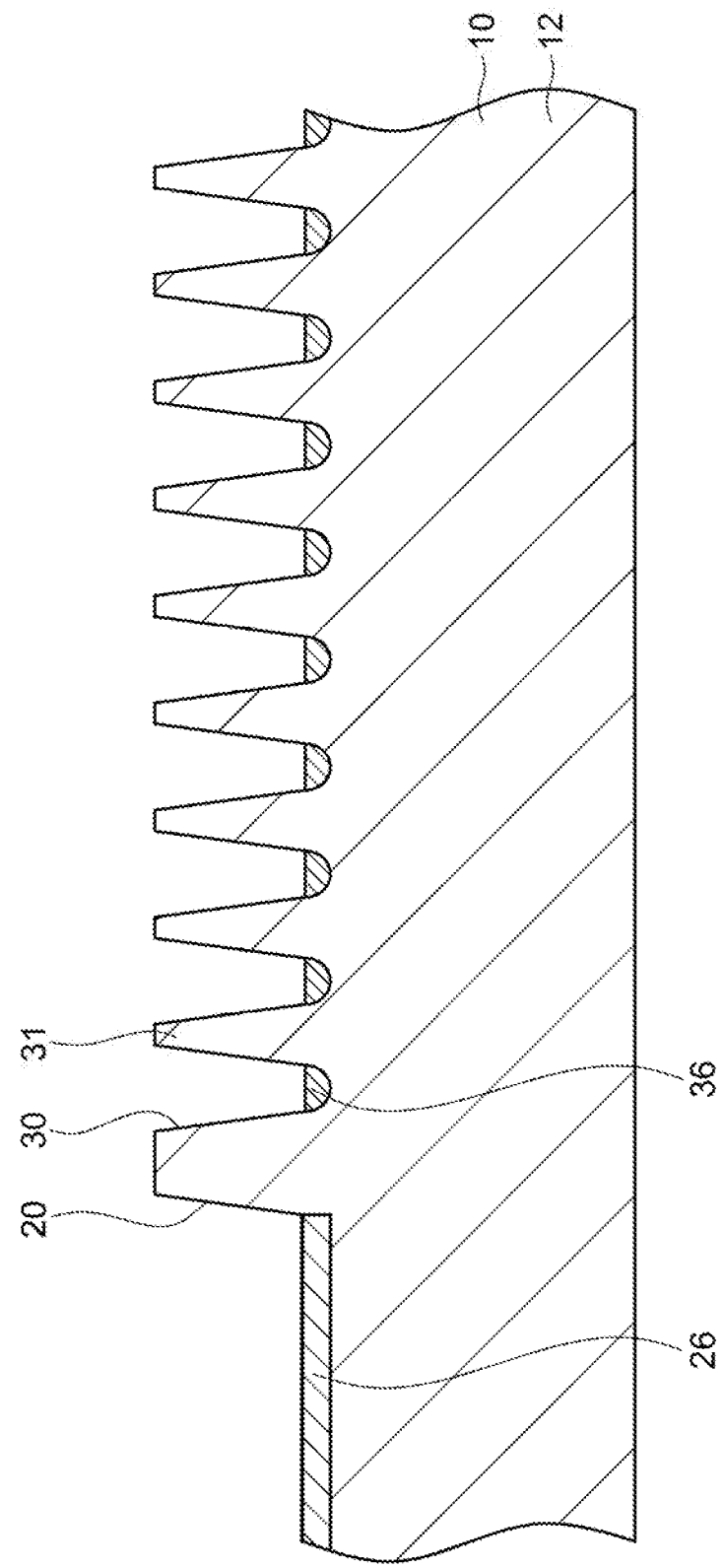
FIG. 4 is a cross-sectional view (1) schematically showing a method of manufacturing a semiconductor device.

The following describes a method of manufacturing the semiconductor device 100 according to the first embodiment. First, as shown in FIG. 4, the semiconductor substrate 10 is prepared with the plurality of gate trenches 20 and the plurality of termination trenches 30 formed therein. In the first embodiment, the semiconductor substrate 10 is made of SiC. It should be noted that FIG. 4 illustrates only one gate trench 20. At the point in time shown in FIG. 4, the floating region 26 has been formed at the lower end of each of the gate trenches 20. Further, the floating region 36 has been formed at the lower end of each of the termination trenches 30. Further, at this point in time the drift region 12, the body region 13, and the source region 11 have been formed in the semiconductor substrate 10.

Figure 5:
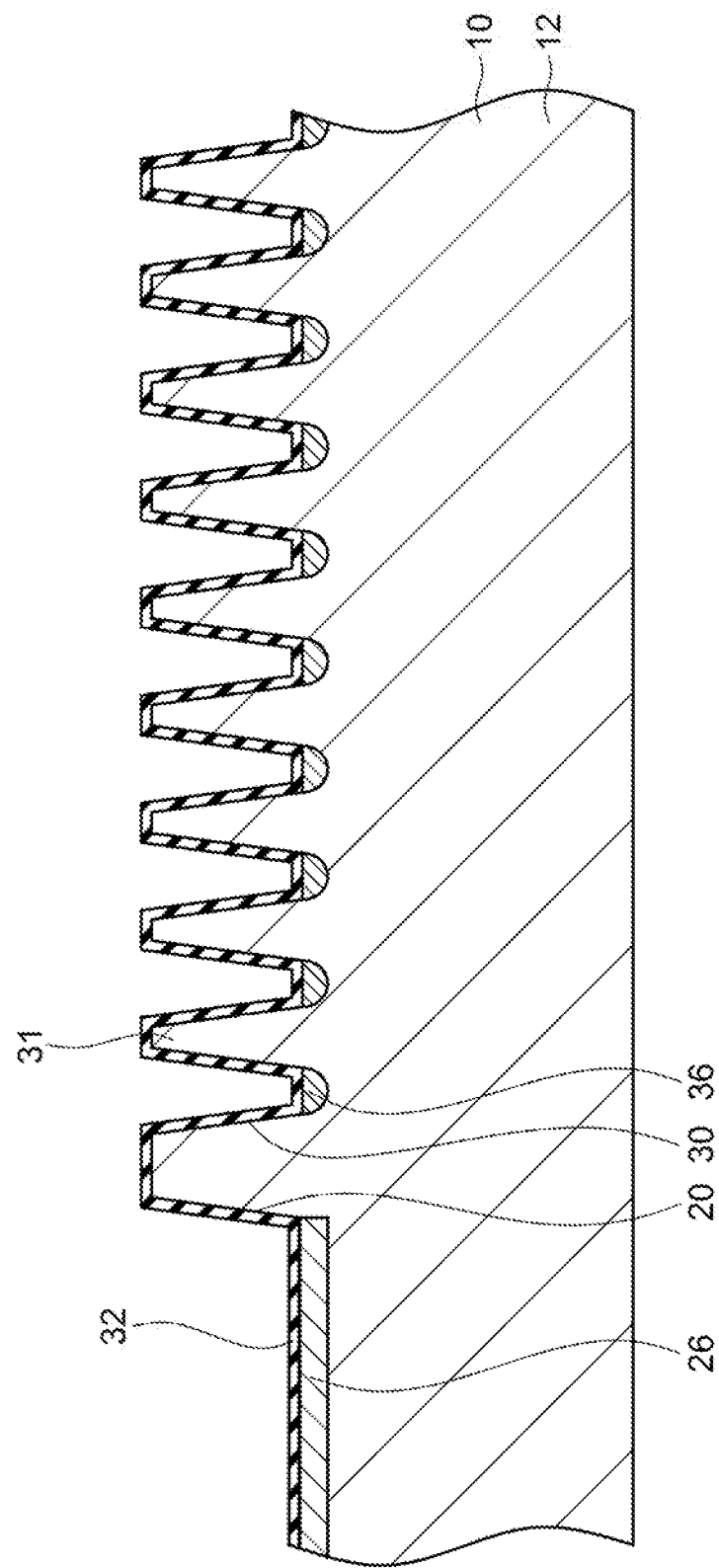
FIG. 5 is a cross-sectional view (2) schematically showing the method of manufacturing a semiconductor device.

Next, as shown in FIG. 5, a first insulating layer 32 is deposited at an inner surface of each of the gate trenches 20, on an inner surface of each of the termination trenches 30, and on the upper surface of the semiconductor substrate 10 (i.e., on the upper surfaces of the partition walls 31 between the adjacent termination trenches 30). In this step, the first insulating layer 32 is formed to have such a thickness as to cover the inner surface of each of the gate trenches 20, the inner surface of each of the termination trenches 30, and the upper surface of the semiconductor substrate 10. The first insulating layer 32 is not formed to have such a thickness as to fill each of the trenches. The first insulating layer 32 is formed by performing CVD with TEOS (Tetra Ethyl Ortho Silicate) as a raw material. In forming the first insulating layer 32, the CVD is executed under a low pressure. The execution of CVD under a low pressure makes its deposition rate (i.e., deposition speed) slower and allows the first insulating layer 32 to be formed as a dense insulating layer. It should be noted that the first insulating layer 32 is not embedded very well when the CVD is executed under a low pressure. However, the embeddability will not be problematic, as the first insulating layer 32 is so thinly formed as to cover each surface. The first insulating layer 32 can be suitably grown.

Figure 6:
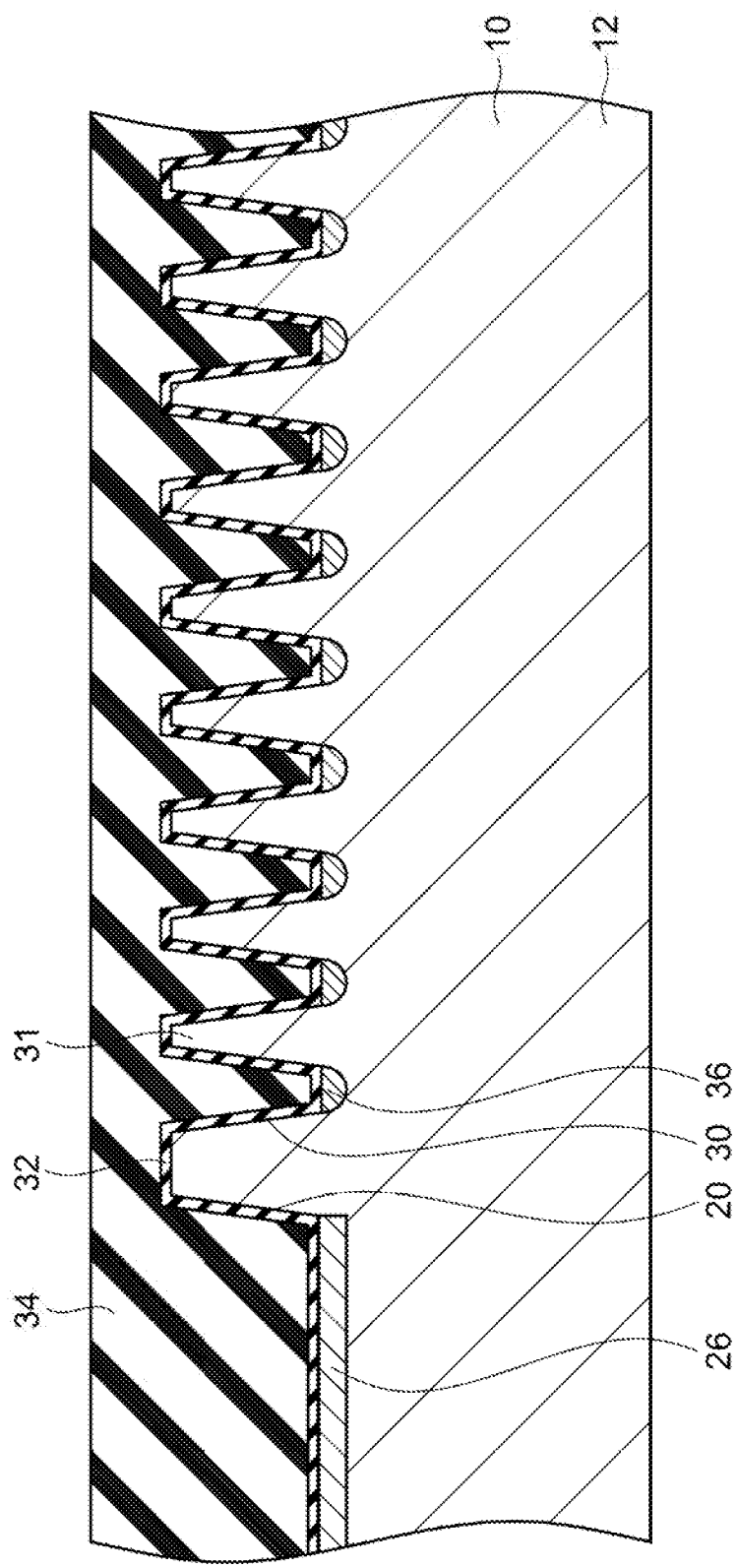
FIG. 6 is a cross-sectional view (3) schematically showing the method of manufacturing a semiconductor device.

Next, as shown in FIG. 6, a second insulating laser 34 is deposited at an upper surface of the first insulating layer 32 thus formed. In this step, the second insulating layer 34 fills each of the gate trenches 20 and each of the termination trenches 30, and is also laminated on the upper surface of the semiconductor substrate 10. As with the first insulating layer 32, the second insulating layer 34 is formed by performing CVD with TEOS as a raw material. Note, however, that, in forming the second insulating layer 34, the CVD is executed under a higher pressure than in the case where the first insulating layer 32 is formed. The execution of CVD under a high pressure makes its deposition rate faster and allows the second insulating layer 34 to be formed as a sparse insulating layer. The second insulating layer 34, which is a sparse insulating layer, is excellent in embeddability into trenches, thus making it possible to restrain a void from being formed in the trenches. Therefore, the second insulating layer 34 can be suitably formed without a void being formed in the trenches.

Figure 7:
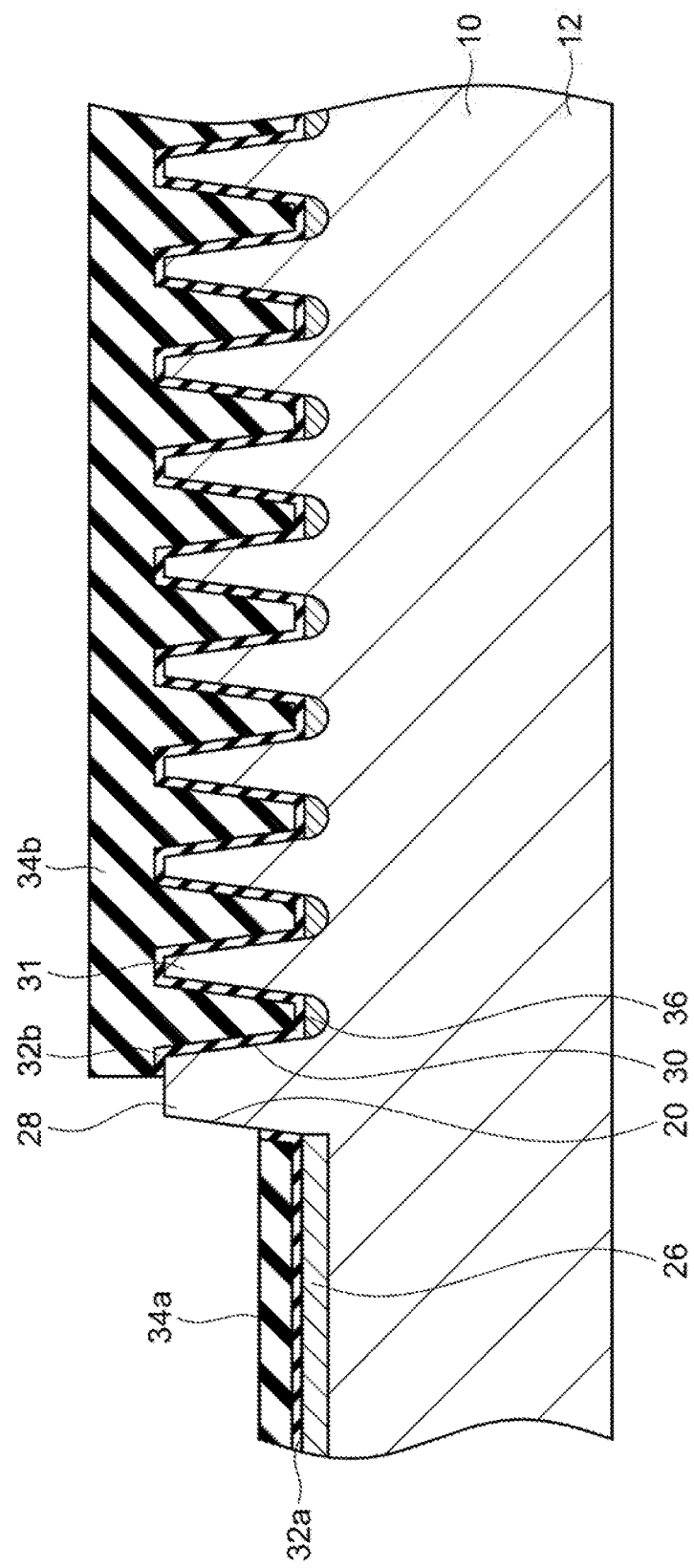
FIG. 7 is a cross-sectional view (4) schematically showing the method of manufacturing a semiconductor device.

Next, as shown in FIG. 7, a part of the first insulating layer 32 and the second insulating layer 34 in the gate trenches 20 is removed by etch back. At the same time, a part of the first insulating layer 32 and the second insulating layer 34 at the upper surface of the partition wall 28 between the gate trenches 20 and the termination trench 30 is also removed. The etch back is performed by performing dry etching after having formed a protective film above the termination trenches 30. This causes as part of the first insulating layer 32, i.e. a first insulating layer 32a, and a part of the second insulating layer 34, i.e., a second insulating layer 34a, to remain in the gate trenches 20. Further, a first insulation layer 32b and a second insulating layer 34b remain inside of and above the termination trenches 30. As noted above, since a void is difficult to be formed during the formation of the second insulating layer 34, an upper surface shape of the second insulation layer 34a remaining in the gate trenches 20 is flat. As a result of this, a concave portion or the like is not formed in the second insulating layer 34a remaining in the gate trenches 20. This allows the second insulating layer 34a in the gate trenches 20 to exhibit favorable insulation performance.

Next, the semiconductor substrate 10 is subjected to heat oxidation treatment. This densities and stabilizes the first insulating layers 32a and 32b and the second insulating layers 34a and 34b that have been formed by CVD. During the heat treatment, each of the insulating layers contracts. Note here that the first insulating layers 32a and 32b, which are dense insulating layers, are more difficult to contract than the second insulating layers 34a and 34b, which are sparse insulating layers. Since the first insulating layers 32a and 32b, which is difficult to contract, are arranged in each of the trenches, an excessive stress is prevented from being generated in each of the trenches. This in turn makes it possible to restrain the first insulating layers 32a and 32b and the second insulating layers 34a and 34b from cracking. After the densification by such heat treatment, the refraction indices of the first insulating layers 32a and 32b are larger than the retraction indices of the second insulating layers 34a and 34b. Further, this heat oxidation treatment also serves as a process for forming a sacrificial oxide film on inner wall surfaces of the gate trenches 20. Therefore, this heat oxidation treatment allows a sacrificial oxide film to be formed on the inner wall surfaces of the gate trenches 20. Thereafter, the oxide film formed on the inner wall surfaces of the gate trenches 20 is removed by wet etching. This removes a layer damaged by the dry etching.

Figure 8:
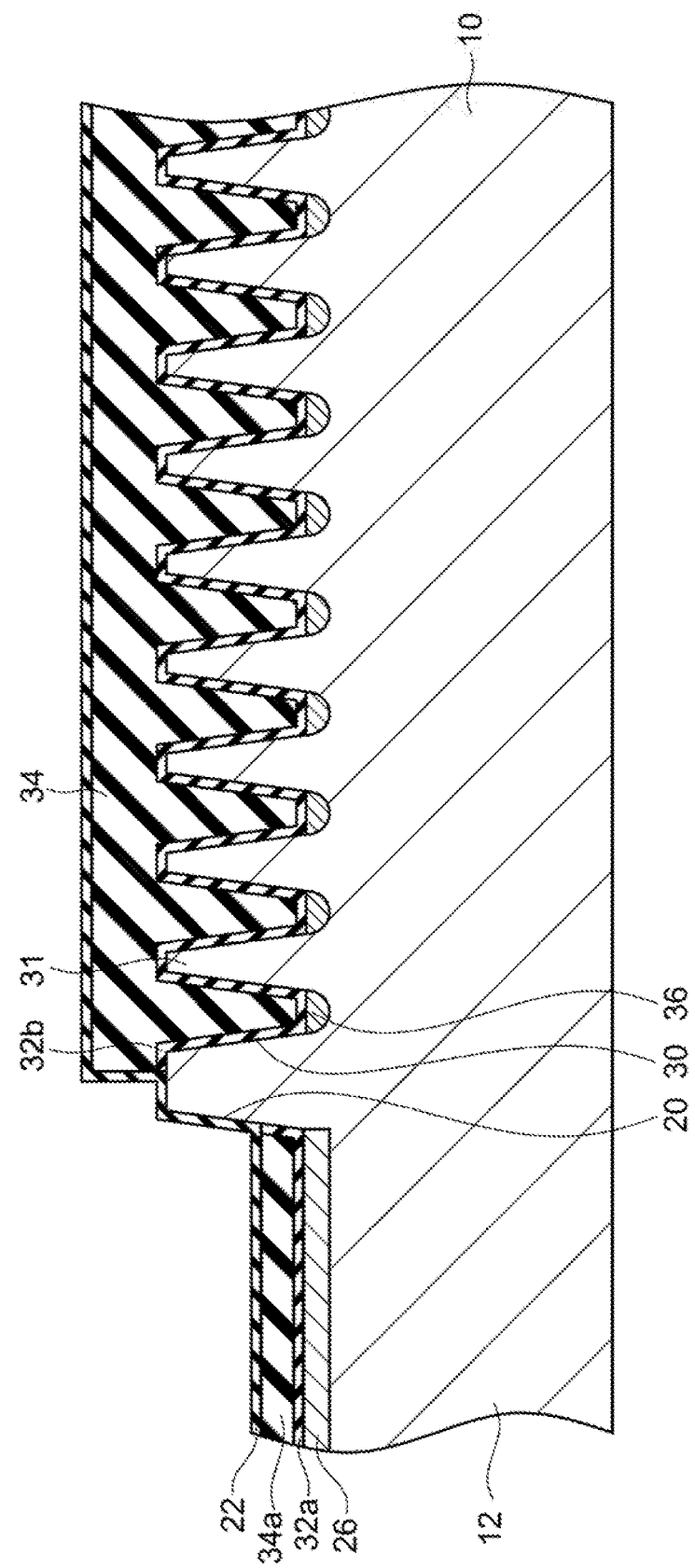
FIG. 8 is a cross-sectional view (5) schematically showing the method of manufacturing a semiconductor device.

Next, as shown in FIG. 8, the gate insulating film 22 is formed by CVD or the like.

Figure 9:
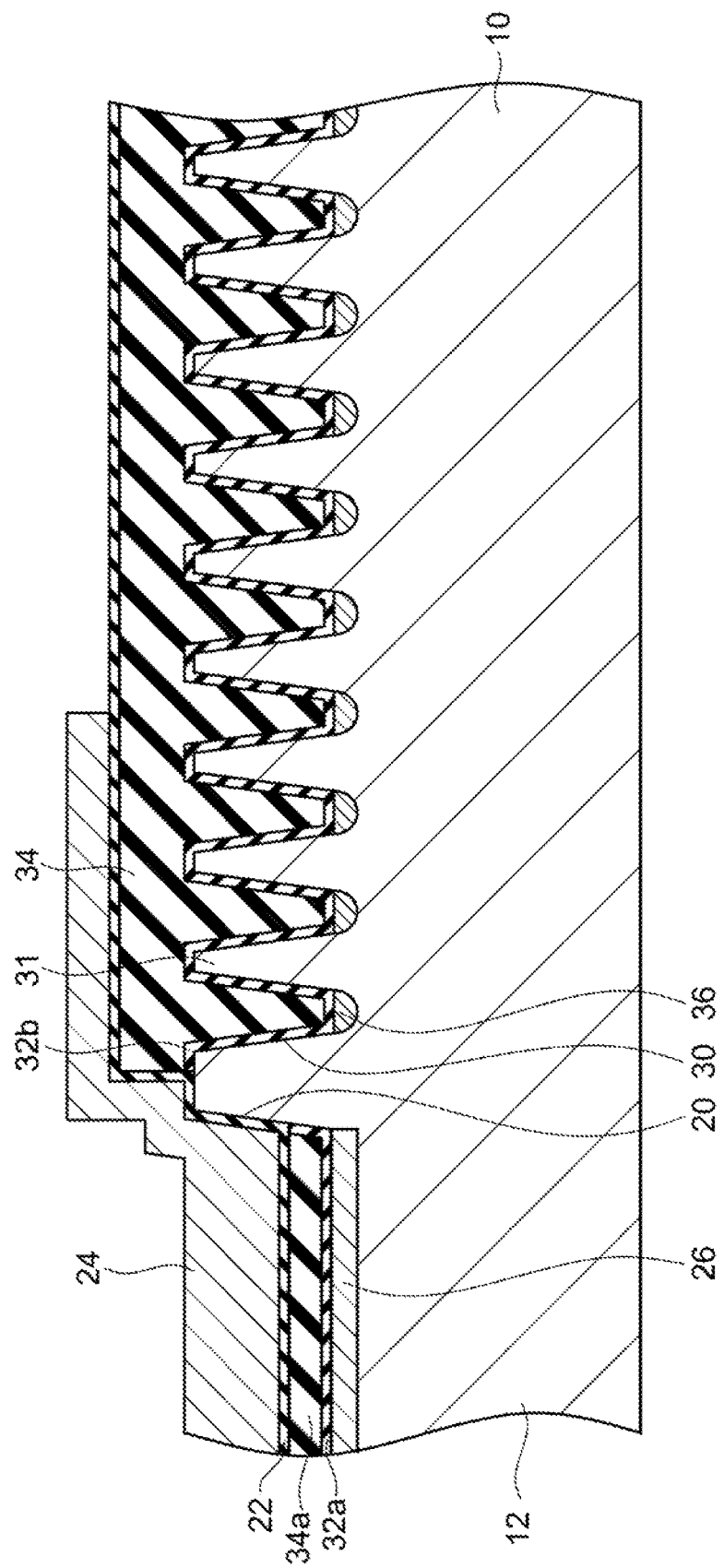
FIG. 9 is a cross-sectional view (6) schematically shoeing the method of manufacturing a semiconductor device.

Next, as shown in FIG. 9, the gate electrode 24 is formed in the gate trenches 20 by depositing polysilicon in a space that has been secured by the etch back. At this occasion, a part of the gate electrode 24 extends onto an upper surface of the gate insulating film 22 formed above a part of the termination trenches 30.

Thereafter, an interlayer insulating film 40 is formed at the upper surface of the semiconductor substrate 10 (see FIG. 2). The interlayer insulating film 40 is formed by depositing BPSG (Boron Phosphorus Silicon Glass) by CVD. As noted above, the interlayer insulating film 40, which is made of BPSG, has higher phosphorus and boron contents per unit volume than the first and second insulating films 32a and 34a, which are TEOS films. As a result of this, the interlayer insulating film 40 is formed at an upper surface of the gate electrode 24 and the upper surface of the gate insulating film 22 in an area in which the gate electrode 24 is not formed.

Thereafter, the contact hole 42 is formed in a portion of the interlayer insulating film 40 that is formed at the upper surface of the gate electrode 24 (see FIG. 2). Next, the gate wiring 44 made of metal is formed at the upper surface of the interlayer insulating film 40. The gate wiring 44 passes through the contact hole 42 and is electrically connected to the gate electrode 24.

Furthermore, thereafter, the drain region 14 is formed on the back surface of the semiconductor substrate 10. The drain region 14 is formed by performing laser annealing after having implanted impurities into the back surface of the semiconductor substrate 10. Next, the drain electrode 18 is formed on an entirety of the back surface of the semiconductor substrate 10. The drain electrode 18 can be formed, for example, by sputtering.

By performing these steps, the semiconductor device 100 shown in FIG. 2 is completed.

In the semiconductor device 100 according to the first embodiment, the refraction indices of the first insulating layers 32a and 32b are larger than the refraction indices of the second insulating layers 34a and 34b. As noted above, the first insulating layers 32a and 32b are difficult to contract in the process of manufacturing the semiconductor device 100. The second insulating layers 34a and 34b are easy to contract in the process of manufacturing the semiconductor device 100. Since the first insulating layers 32a and 32b and the second insulating layers 34a and 34b are located in the trenches (i.e., the gate trenches 21) and the termination trenches 30), an excessive stress is prevented from being generated due to the contraction of the insulating material in the process of manufacturing the semiconductor device 100. Therefore, in the process of manufacturing the semiconductor device 100, the insulating layers in the trenches are difficult to crack. Further, although the first insulating layers 32a and 32b are not very good in embeddability in the process of manufacturing the semiconductor device 100, the embeddability of the insulating material will not be problematic during the formation of the first insulating layers 32a and 32b, as the first insulating layers 32a and 32b are formed to cover the inner surfaces of the trenches. Thereafter, in forming the second insulating layers 34a and 34b at surfaces of the first insulating layers 32a and 32b, the second insulating layers 34a and 34b can be suitably formed, as the insulating material is good in embeddability. Therefore, in the process of manufacturing the semiconductor device 100, a void is difficult to be generated in the insulating layers in the trenches. That is, the semiconductor device 100 is difficult to suffer from a void or a crack in the manufacturing process.

Further, in the manufacturing method according to the first embodiment, the first insulating layer 32 is formed by executing CVD under a relatively low pressure (see FIG. 5), and then the second insulating layer 34 is formed by executing CVD under a higher pressure than in the case were the first insulating layer 32 is formed (see FIG. 6). The execution of CVD under a low pressure makes it possible to form the first insulation layer 32 (i.e., a dense insulating layer), which is difficult to contract during the subsequent heat treatment. The execution of CVD under a high pressure makes it possible to form the second insulating layer 34 (i.e., a sparse insulating layer), which is good in embeddability into the termination trenches 30. That is, the manufacturing method according to the first embodiment makes it possible to suitably form the semiconductor device 100 including the features described above.

Second Embodiment

Figure 10:
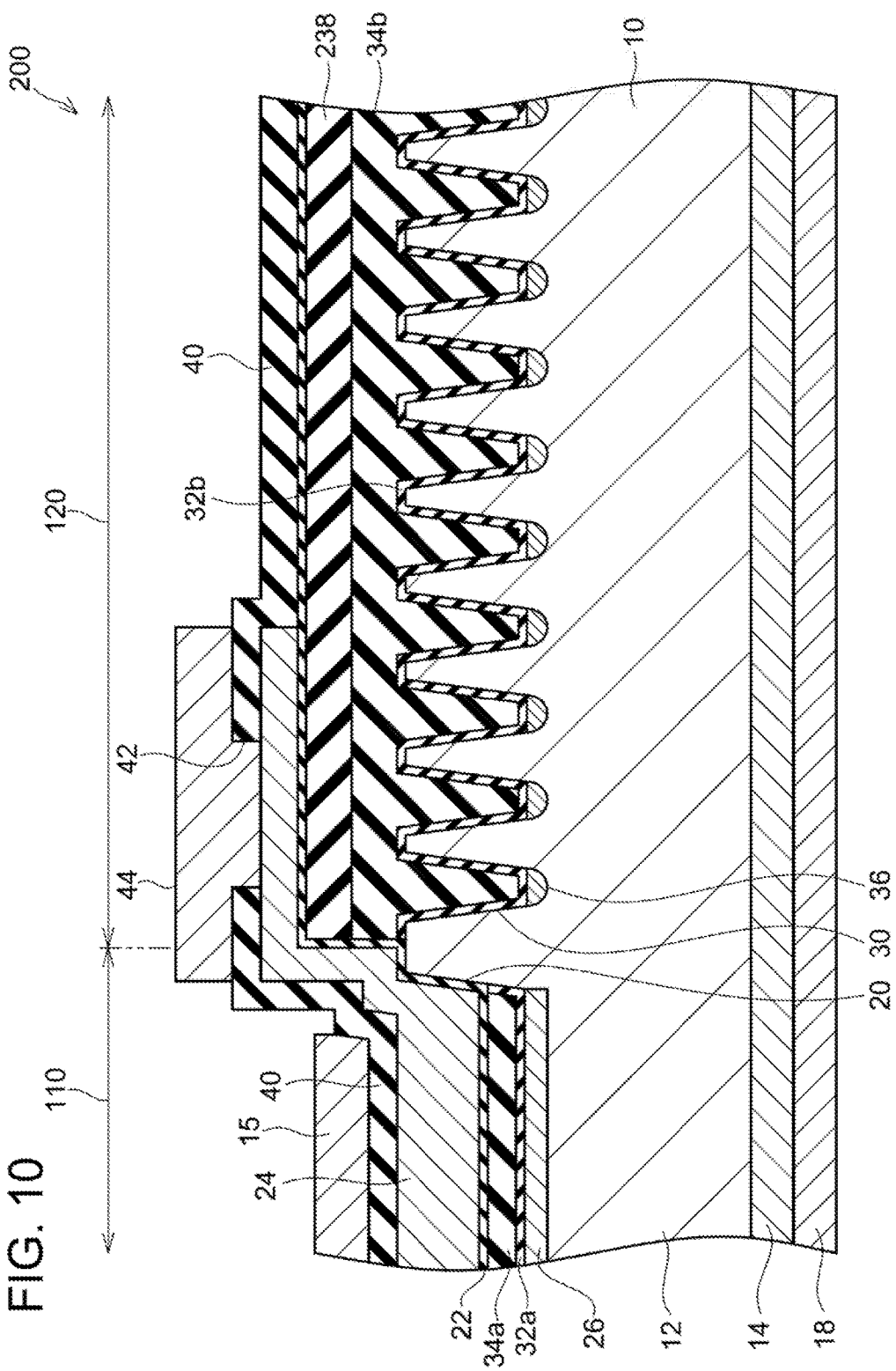
FIG. 10 is a cross-sectional view of a semiconductor device according to a second embodiment as taken along the line II-II.

In the following, a semiconductor device 200 according to a second embodiment will be described with reference to FIG. 10 mainly focusing an different points from the first embodiment. The semiconductor device 200 according to the second embodiment has a common basic configuration with the semiconductor device 100 according to the first embodiment (see FIG. 2). Those elements of the semiconductor device 200 according to the second embodiment which are identical to those of the semiconductor device 100 according to the first embodiment are given the same reference numbers in FIG. 10.

The semiconductor device 200 according to the second embodiment differs from the semiconductor device 100 according to the first embodiment in that, in the termination region 120, a third insulating layer 238 is provided at the upper surface of the second insulating layer 34b. A refraction index of the third insulating layer 238 is larger than the refraction index of the second insulating layer 34b. It should be noted that either the refraction index of the third insulating layer 238 or the refraction index of the first insulating layer 32b may be larger than the other, or the refraction index of the third insulating layer 238 and the refraction index of the first insulating layer 32b may be equal to each other. The gate insulating film 22 is provided at an upper surface of the third insulating layer 238.

(Manufacturing Method)

A method of manufacturing the semiconductor device 200 is basically the same as the manufacturing method according to the first embodiment. Note, however, that after the second insulating layer 34 has been deposited at the upper surface of the first insulating layer 32 (see FIG. 6), a step of depositing the third insulating layer 238 at the upper surface of the second insulating layer 34 is executed. As with the first insulating layer 32 and the second insulating layer 34, the third insulating layer 238 is formed by performing CVD with TEOS as a raw material. In forming the third insulating layer 238, the CVD is executed at a lower pressure than in the case where the second insulating layer 34 is formed. This makes it possible to form the third insulating layer 238 as a dense insulating layer at the upper surface of the second insulating layer 34. Although the CVD under a low pressure is poor in embeddability of the insulating material, the embeddability will not be problematic, as the third insulating layer 238 is formed on a flat surface.

In the second embodiment, the third insulating layer 238 in an area corresponding to the element region 110 is then removed by etch back. At this occasion, a part of the first and second insulating layers 32 and 34 in the gate trenches 20 and a part of the first and second insulating layers 32 and 34 at the upper surface of the partition wall 28 between the gate trenches 20 and the termination trench 30 are also removed. This causes a part of the first insulating layer 32, i.e., the first insulating layer 32a, and a part of the second insulating layer 34, i.e., the second insulating layer 34a, to remain in the gate trenches 20. Further, the first insulating layer 32b, the second insulating layer 34b, and the third insulating layer 238 remain inside of and above the termination trenches 30 (see FIG. 10). Thereafter, each of the insulating layers is densified by heat treatment. As with the first insulating layer 32, the third insulating layer 238 has a low contraction percentage during heat treatment. This restrains a crack from being generated in vicinity of the third insulating layer 238. The subsequent steps are identical to those of the first embodiment, and as such, will not be described in detail below (see FIGS. 8 and 9).

In the semiconductor device 200 according to the second embodiment, the third insulating layer 238 is provided at the upper surface of the second insulating layer 34b. The refraction index of the third insulating layer 238 is larger than the refraction index of the second insulating layer. The third insulating layer 238, whose refraction index is small, is difficult to contract in the process of manufacturing the semiconductor device 200. This makes it possible to restrain the insulating layers (i.e., the first insulating layers 32a and 32b, the second insulating layers 34a and 34b, and the third insulating layer 238) from cracking. Further, since a thick insulating layer can be formed below the gate wiring 44, the semiconductor device 200 can be made higher in voltage resistance.

Specific examples of the art disclosed herein have been described in detail, however, these are mere exemplary indications and thus do not limit the scope of the claims. The art described in the claims include modifications and variations of the specific examples presented above. For example, the following modifications may be implemented.

(Modification 1) In each of the embodiments described above, the semiconductor substrate 10 is made of SiC. This does not imply any limitation. The semiconductor substrate 10 may alternatively be made of Si.

(Modification 2) Although the semiconductor devices 100 and 200 are power MOSFETs in each of the embodiments described above, they may be any arbitrary semiconductor devices, as long as they are trench-gate-type semiconductor devices. For example, the semiconductor devices 100 and 200 may alternatively be IGBTs.

Technical features described in the description and the drawings may technically be useful alone or in various combinations, and are not limited to the combinations as originally churned. Further, the art described in the description and the drawings may concurrently achieve a plurality of aims, and technical significance thereof resides in achieving any one of such aims.

The invention claimed is:
1. A semiconductor device comprising:
an element region and a termination region;
a semiconductor substrate common to the element region and the termination region;
wherein the element region comprises:
a gate trench provided at a surface of the semiconductor substrate;
a first insulating layer covering an inner surface of the gate trench;
a second insulating layer located at a surface of the first insulating layer in the trench, wherein a refraction index of the first insulating layer is larger than a refraction index of the second insulating layer;
a gate insulating film on the upper surface of the second insulating film; and
a gate electrode inside the gate insulating film and extending along the entire cross-sectional length of the element region,
wherein the termination region comprises:
a termination trench provided at a surface of the semiconductor substrate;
a first termination insulating layer covering an inner surface of the termination trench; and
a second termination insulating layer located at a surface of the first termination insulating layer in the termination trench, wherein a refraction index of the first termination insulating layer is larger than a refraction index of the second termination insulating layer,
wherein the gate insulating film extends along the upper surface of the second termination insulating film, and
wherein the gate electrode extends along only a part of the cross-sectional length of the termination region.

* * * * *